(12) United States Patent
Du (10) Patent No.: US 11,417,855 B2
(45) Date of Patent: Aug. 16, 2022

(54) DISPLAY DEVICE AND MANUFACTURING METHOD THEREOF

(71) Applicant: SHENZHEN CHINA STAR OPTOELECTRONICS SEMICONDUCTOR DISPLAY TECHNOLOGY CO., LTD., Guangdong (CN)

(72) Inventor: Yanying Du, Guangdong (CN)

(73) Assignees: SHENZHEN CHINA STAR OPTOELECTRONICS, Shenzhen (CN); SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 340 days.

(21) Appl. No.: 16/624,208

(22) PCT Filed: Nov. 28, 2019

(86) PCT No.: PCT/CN2019/121467
§ 371 (c)(1),
(2) Date: Dec. 18, 2019

(87) PCT Pub. No.: WO2021/093031
PCT Pub. Date: May 20, 2021

(65) Prior Publication Data
US 2021/0335914 A1    Oct. 28, 2021

(30) Foreign Application Priority Data

Nov. 15, 2019   (CN) .......................... 201911121890.0

(51) Int. Cl.
*H01L 27/32*   (2006.01)
*H01L 51/52*   (2006.01)
*H01L 51/56*   (2006.01)

(52) U.S. Cl.
CPC ...... *H01L 51/5237* (2013.01); *H01L 27/3223* (2013.01); *H01L 27/3246* (2013.01);
(Continued)

(58) Field of Classification Search
CPC ............. H01L 51/5221; H01L 51/5243; H01L 51/5237; H01L 27/3258
See application file for complete search history.

(56) References Cited

U.S. PATENT DOCUMENTS 6,822,264 B2 * 11/2004 Yamazaki ............... H01L 27/12
257/49
7,129,523 B2 * 10/2006 Yamazaki ............... H01L 27/12
257/59
(Continued)

FOREIGN PATENT DOCUMENTS

CN          1652648 A      8/2005
CN        102057513 A      5/2011
(Continued)

OTHER PUBLICATIONS

International Search Report, International application No. PCT/CN2019/121467, dated Jul. 28, 2020. (Year: 2020).*
(Continued)

*Primary Examiner* — Victoria K. Hall
(74) *Attorney, Agent, or Firm* — Geoffrey A. Lottenberg; Berger Singerman LLP (57) ABSTRACT

A display device and a manufacturing method thereof are provided. The display device includes a display area, a non-display area surrounding the display area, a thin film transistor structure layer, a ring-shaped metal layer, a luminous layer, and a first electrode. The ring-shaped metal layer is disposed in the non-display area. The thin film transistor structure layer includes a passivation layer including a protrusion corresponding to the ring-shaped metal layer. The
(Continued)

first electrode extends from the display area to the protrusion, and extends from a surface of the protrusion to a surface of the ring-shaped metal layer.

8 Claims, 4 Drawing Sheets

(52) U.S. Cl.
CPC ...... *H01L 27/3258* (2013.01); *H01L 51/5221* (2013.01); *H01L 51/5243* (2013.01); *H01L 51/5246* (2013.01); *H01L 51/5253* (2013.01); *H01L 51/5259* (2013.01); *H01L 51/56* (2013.01); *H01L 2227/323* (2013.01)

(56) References Cited

U.S. PATENT DOCUMENTS

| | | | | |
|---|---|---|---|---|
| 7,619,258 | B2* | 11/2009 | Tsuchiya | H01L 27/3258 257/83 |
| 8,222,809 | B2* | 7/2012 | Lee | H01L 51/5246 313/506 |
| 8,922,461 | B2* | 12/2014 | Sagawa | H01L 27/3262 345/76 |
| 10,347,706 | B2* | 7/2019 | Kim | H01L 27/3262 |
| 10,446,793 | B2* | 10/2019 | Kim | H01L 27/3225 |
| 10,680,044 | B2* | 6/2020 | Go | H01L 51/5246 |
| 10,861,880 | B2* | 12/2020 | Harada | H01L 27/124 |
| 11,171,195 | B2* | 11/2021 | Kim | H01L 27/124 |
| 2003/0094615 | A1* | 5/2003 | Yamazaki | H01L 27/3244 257/72 |
| 2005/0056840 | A1* | 3/2005 | Yamazaki | H01L 27/124 257/59 |
| 2007/0034875 | A1* | 2/2007 | Yamazaki | H01L 51/5259 257/59 |
| 2009/0200930 | A1 | 8/2009 | Hayashi | |
| 2009/0273548 | A1* | 11/2009 | Sagawa | H01L 27/3262 345/76 |
| 2010/0072482 | A1* | 3/2010 | Eom | H01L 27/3276 257/72 |
| 2011/0163331 | A1 | 7/2011 | Yamazaki et al. | |

FOREIGN PATENT DOCUMENTS

| | | |
|---|---|---|
| CN | 103855315 A | 6/2014 |
| CN | 110098346 A | 8/2019 |
| CN | 110311056 A | 10/2019 |

OTHER PUBLICATIONS

Written Opinion of International Searching Authority, International application No. PCT/CN2019/121467, dated Jul. 28, 2020. (Year: 2020).*

Machine translation of Written Opinion of International Searching Authority, International application No. PCT/CN2019/121467, dated Dec. 21, 2021. (Year: 2021).*

* cited by examiner

DISPLAY DEVICE AND MANUFACTURING METHOD THEREOF

CROSS REFERENCE TO RELATED APPLICATIONS

This application is the National Phase under 35 U.S.C. § 371 of International Application No. PCT/CN2019/121467, FILED Nov. 28, 2019, which claims the benefit and priority of a Chinese Patent Application No. 201911121890.0, filed on Nov. 15, 2019, titled "DISPLAY DEVICE AND MANUFACTURING METHOD THEREOF", the entire contents of which are incorporated herein by reference.

FIELD OF DISCLOSURE

The present disclosure relates to the field of display technologies, and in particular, to a display device and a manufacturing method thereof.

BACKGROUND

An organic light emitting diode (OLED) display includes two electrodes and an organic luminous layer between them. Electrons and holes are injected from the two electrodes into the organic luminous layer to form excitons. The exciton emits light as it releases energy.

The above organic light emitting element is located on a substrate, and the organic luminous layer material is sensitive to external factors such as moisture and oxygen that may cause damage, which affects a display performance of the product. Therefore, it is particularly important to encapsulate the light emitting element.

In large-size organic light-emitting display devices, there are currently two mainstream encapsulation technologies. A first encapsulation method is to encapsulate the light-emitting device with a sealant, a moisture absorbent, and a filler. The sealant is configured to prevent permeation of moisture. The moisture absorbent absorbs moisture passing through the sealant, and the filler is filled on an entire surface to improve a mechanical strength of a screen. A second encapsulation method is surface encapsulation, which uses an integrated metal foil and a film that has water-blocking and moisture-absorbing properties to achieve a sealing function. Both the first encapsulation method and the second encapsulation method contain organic matter. After the organic matter is cured, a molecular gap of which is large, and external moisture and oxygen are slowly permeated to the organic luminous layer through the gap, thereby degrading a performance of the organic light emitting material. In order to extend a lifespan of the display device, an inorganic layer is covered on top of the light-emitting element, so that the light-emitting element blocks moisture and oxygen that has passed through the adhesive material. A stress of the inorganic layer is relatively large, especially cracks and separation are likely to occur at an edge of the layer, which in turn makes moisture and oxygen continue to permeate and transmit, which affects an encapsulation performance. Therefore, improving a reliability of the display device to extend its lifespan has become one of key technical issues.

An object of this disclosure is to provide a display device and a manufacturing method thereof to solve technical problems of a poor encapsulation performance of a light emitting elements existing in the prior art, which easily causes external moisture and oxygen to permeate into the organic luminous layer, degrades the performance of the organic light emitting material, affects a lifespan of the display device.

SUMMARY OF DISCLOSURE

In order to achieve the above object, the present disclosure provides a display device, including a display area and a non-display area surrounding the display area. The display device includes a thin film transistor structure layer, a ring-shaped metal layer, a luminous layer, and a first electrode. The ring-shaped metal layer is disposed in the thin film transistor structure layer. The ring-shaped metal layer is disposed in the non-display area and surrounds the display area. The luminous layer is disposed on the thin film transistor structure layer and disposed in the display area. A first electrode is disposed above the luminous layer, extends from the display area to a surface of the ring-shaped metal layer of the non-display area, and completely covers the surface of the ring-shaped metal layer.

Furthermore, the thin film transistor structure layer includes a substrate, a buffer layer, and active layer, a gate insulating layer, a gate, a dielectric layer, a source, a drain, a passivation layer, a planarization layer, a pixel electrode, and a pixel definition layer. The buffer layer is disposed on the substrate and extends from the display area to the non-display area. The active layer is disposed on the buffer layer. The gate insulating layer is disposed on the active layer. The gate is disposed on the gate insulating layer of the display area. The dielectric layer is disposed on the buffer layer. The dielectric layer covers the gate, and the dielectric layer extends from the display area to the non-display area. The source and the drain are disposed on the dielectric layer of the display area and connected to the active layer. The passivation layer is disposed on the source and the drain and extends from the display area to the non-display area. The passivation layer includes a protrusion corresponding to the ring-shaped metal layer. The planarization layer is disposed on the passivation layer. The pixel electrode is disposed on the planarization layer of the display area and connected to the source and the drain. The pixel definition layer is disposed on the planarization layer and the pixel electrode of the display area. The first electrode extends from the pixel definition layer of the display area to the protrusion of the non-display area, extends from a surface of the protrusion to a surface of the ring-shaped metal layer, and completely covers the surface of the ring-shaped metal layer.

Furthermore, the ring-shaped metal layer is disposed on the dielectric layer and is arranged on the same layer as the source and the drain, or the ring-shaped metal layer is disposed on the dielectric layer and protrudes from the passivation layer.

Furthermore, a height of the protrusion is higher or lower than the passivation layer.

Furthermore, the display device further includes an inorganic layer, a cover layer, a moisture absorption layer, a sealant layer, and a cover plate. The inorganic layer is disposed on the first electrode and extends from the display area to the non-display area. The cover layer is disposed on the inorganic layer and extends from the display area to the non-display area. The moisture absorption layer is disposed on the substrate of the non-display area and surrounds the cover layer. The sealant layer is disposed on the substrate of the non-display area and surrounds the moisture absorption layer. The cover plate is disposed on the cover layer, the moisture absorption layer, and the sealant layer.

Furthermore, the display device further includes an inorganic layer, a water-blocking and moisture-absorbing adhesive layer, and a metal foil. The inorganic layer is disposed on the first electrode and extends from the display area to the non-display area. The water-blocking and moisture-absorbing adhesive layer is disposed on the inorganic layer and extends from the display area to the non-display area. The metal foil is disposed on the water-blocking and moisture-absorbing adhesive layer and extends from the display area to the non-display area.

Furthermore, the display device further includes a first recess disposed in the display area. The first recess extends from the pixel definition layer to a surface of the passivation layer, and the first electrode and the inorganic layer are sequentially disposed in the first recess.

In order to achieve the above object, the present disclosure provides a manufacturing method of a display device. The display device includes a display area and a non-display area surrounding the display area. The manufacturing method of the display device includes steps of: forming a thin film transistor structure layer; forming a ring-shaped metal layer in the thin film transistor structure layer, where the ring-shaped metal layer is disposed in the non-display area and surrounds the display area; forming a luminous layer on the thin film transistor structure layer and disposed in the display area; and forming a first electrode above the luminous layer, where the first electrode extends from the display area to a surface of the ring-shaped metal layer of the non-display area, and completely covers the surface of the ring-shaped metal layer.

Furthermore, the step of forming the thin film transistor structure layer includes steps of: providing a substrate; forming a buffer layer on the substrate, where the buffer layer extends from the display area to the non-display area; forming an active layer on the buffer layer of the display area; forming a gate insulating layer on the active layer; forming a gate on the gate insulating layer of the display area; forming a dielectric layer on the buffer layer, where the dielectric layer covers the gate, the dielectric layer extends from the display area to the non-display area, and the dielectric layer includes a first through hole and a second recess; forming a source and a drain in the first through hole, where the source and the drain protrude from a surface of the dielectric layer of the display area, and the source and the drain are connected to the active layer; forming the ring-shaped metal layer in the second recess, where the ring-shaped metal layer protrudes from the surface of the dielectric layer and is disposed on the same layer as the source and the drain; forming a passivation layer on the source, the drain, and the dielectric layer, where the passivation layer extends from the display area to the non-display area, and the passivation layer including a protrusion corresponding to the ring-shaped metal layer; forming a planarization layer on the passivation layer; forming a pixel electrode on the planarization layer of the display area and connecting the pixel electrode to the source and the drain; and forming a pixel definition layer on the planarization layer and the pixel electrode of the display area. After the thin film transistor structure layer is formed, the manufacturing method further includes steps of: forming the first electrode on the luminous layer and the pixel definition layer, where the first electrode extends from the display area to the surface of the ring-shaped metal layer of the non-display area, and completely covers the surface of the ring-shaped metal layer; forming an inorganic layer on the first electrode, where the inorganic layer extends from the display area to the non-display area; forming a cover layer over a cover plate; forming a moisture absorption layer on the cover plate of the non-display area, where the moisture absorption layer surrounds the cover layer; forming a sealant layer on the cover plate of the non-display area, where the sealant layer surrounds the moisture absorption layer; and attaching the cover plate to the inorganic layer, where the cover layer is disposed on the inorganic layer; and where the first electrode extends from the pixel definition layer of the display area to the protrusion of the non-display area, and extends from a surface of the protrusion to the surface of the ring-shaped metal layer.

Furthermore, the step of forming the thin film transistor structure layer includes steps of: providing a substrate; forming a buffer layer on the substrate, where the buffer layer extends from the display area to the non-display area; forming an active layer on the buffer layer of the display area; forming a gate insulating layer on the active layer; forming a gate on the gate insulating layer of the display area; forming a dielectric layer on the buffer layer, where the dielectric layer covers the gate, and the dielectric layer extends from the display area to the non-display area, and the dielectric layer includes a second through hole; forming a source and a drain in the second through hole, where the source and the drain protrude from a surface of the dielectric layer of the display area, and the source and the drain are connected to the active layer; forming the ring-shaped metal layer on the dielectric layer; forming a passivation layer on the source, the drain, and the dielectric layer, where the passivation layer extends from the display area to the non-display area, and the passivation layer including a protrusion corresponding to the ring-shaped metal layer; forming a planarization layer on the passivation layer of the display area; forming a pixel electrode on the planarization layer of the display area and connecting the pixel electrode to the source and the drain; forming a pixel definition layer on the planarization layer and the pixel electrode of the display area; and forming a first recess, where the first recess extends from the pixel definition layer to a surface of the passivation layer. After the thin film transistor structure layer is formed, the manufacturing method further includes steps of: forming the first electrode in the first recess and on the luminous layer and the pixel definition layer, where the first electrode extends from the display area to the surface of the ring-shaped metal layer of the non-display area, and completely covers the surface of the ring-shaped metal layer; forming an inorganic layer on the first electrode, where the inorganic layer extends from the display area to the non-display area; forming a water-blocking and moisture-absorbing adhesive layer on a metal foil, where the water-blocking and moisture-absorbing adhesive layer extends from the display area to the non-display area; and attaching the metal foil to the inorganic layer, and disposing the water-blocking and moisture-absorbing adhesive layer on the inorganic layer. The first electrode extends from the pixel definition layer of the display area to the protrusion of the non-display area, and extends from a surface of the protrusion to a surface of the ring-shaped metal layer.

The present disclosure provides a display device and a manufacturing method thereof. The first electrode extends from the display area to the surface of the ring-shaped metal layer of the non-display area, and completely covers the surface of the ring-shaped metal layer, thereby forming a direct metal-to-metal contact and improving an ability of preventing external moisture and oxygen from permeating to an interface. If moisture intrudes from a side, a dense oxide film formed on the surface of the first electrode acts as a barrier. At the same time, the passivation layer includes the protrusion corresponding to the ring-shaped metal layer. The protrusion serves as a small dyke to block moisture and oxygen by layers, thereby enhancing a sealing performance of the light emitting element and extending a lifespan.

BRIEF DESCRIPTION OF DRAWINGS

In order to explain technical solutions in embodiments of the present disclosure more clearly, drawings used in the description of the embodiments will be briefly introduced below. Apparently, the drawings in the following description are just some embodiments of the present disclosure. For those skilled in the art, other drawings can be obtained based on these drawings without creative efforts.

Reference numerals of components in the drawings are as follow.

100 display device; 101 display area; 102 non-display area;
1 thin film transistor structure layer; 2 ring-shaped metal layer; 3 luminous layer; 4 first electrode; 5 encapsulation layer;
11 substrate; 12 buffer layer; 13 active layer; 14 gate insulating layer;
15 gate; 16 dielectric layer; 17 source/drain; 18 passivation layer; 19 planarization layer;
20 pixel electrode; 21 pixel definition layer; 22 luminous layer;
18a protrusion; 30 first recess;
51 inorganic layer; 52 cover layer; 53 moisture absorption layer;
54 sealant layer; 55 cover plate; 56 water-blocking and moisture-absorbing adhesive layer; 57 metal foil;
161 first through hole; 162 second recess; 161 second through hole

DETAILED DESCRIPTION

The following describes the preferred embodiments of the present disclosure with reference to the accompanying drawings of the specification to exemplify that the present disclosure can be implemented. These embodiments can completely introduce the technical content of the present disclosure to those skilled in the art, making the technical content of the present disclosure clearer and easier to understand. However, this disclosure can be embodied by many different forms of embodiments, and the scope of protection of this disclosure is not limited to the embodiments mentioned in the text.

First Embodiment

Figure 1:
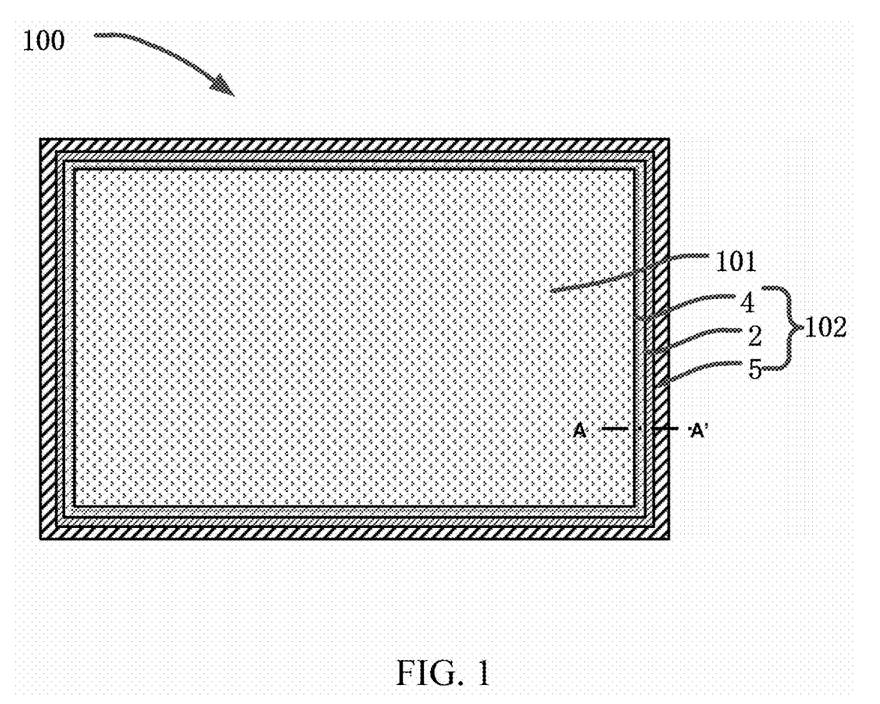
FIG. 1 is a plan view of a display device according to a first embodiment.
Figure 2:
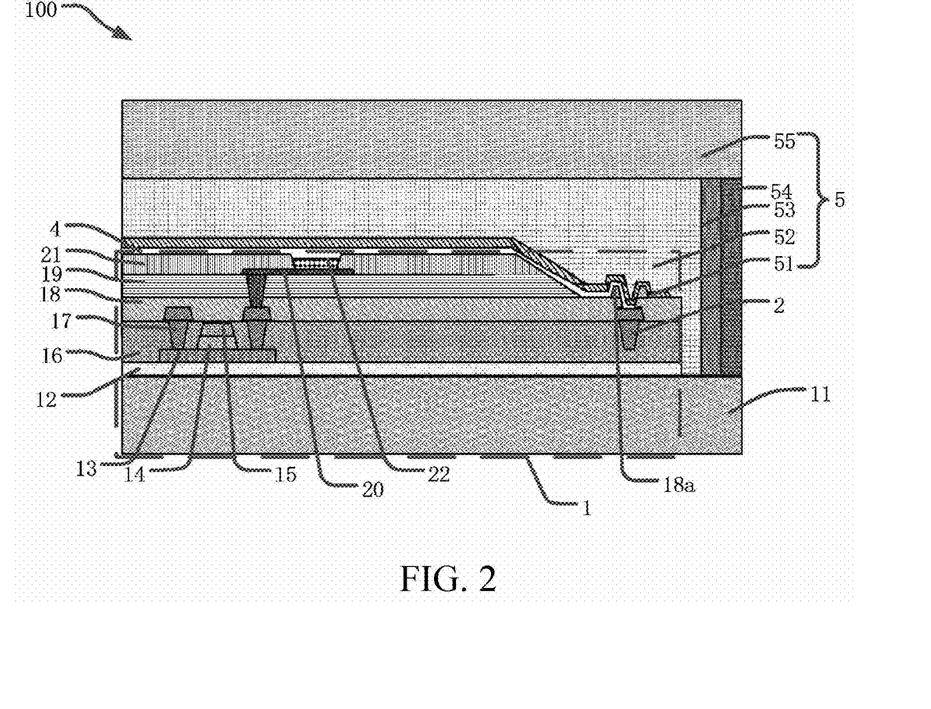
FIG. 2 is a cross-sectional view of the display device of the first embodiment along A line AA' of FIG. 1.

As shown in FIG. 1 and FIG. 2, this embodiment provides a display device 100, which includes a display area 101 and a non-display area 102, and the non-display area 102 surrounds the display area 101.

As shown in FIG. 2, the display device 100 further includes a thin film transistor structure layer 1, a ring-shaped metal layer 2, a luminous layer 22, a first electrode 4, and an encapsulation layer 5. The ring-shaped metal layer 2 is disposed in the thin film transistor structure layer 1, and the ring-shaped metal layer 2 is disposed in the non-display area 102 and surrounds the display area 101. The luminous layer 22 is disposed on the thin film transistor structure layer 1 and is disposed in the display area 101. The first electrode 4 is disposed above the luminous layer 22, extends from the display area 101 to a surface of the ring-shaped metal layer 2 of the non-display area 102, and completely covers the surface of the ring-shaped metal layer 2.

The thin film transistor structure layer 1 includes a substrate 11, a buffer layer 12, an active layer 13, a gate insulating layer 14, a gate 15, a dielectric layer 16, source/drain 17, a passivation layer 18, a planarization layer 19, a pixel electrode 20, and a pixel definition layer 21.

Material of the substrate 11 includes, but is not limited to, glass, ceramic, plastic, and alloy materials.

The buffer layer 12 is disposed on the substrate 11 and extends from the display area 101 to the non-display area 102.

The active layer 13 is disposed on the buffer layer 12 of the display area 101.

The gate insulating layer 14 is disposed on the active layer 13. Material of the gate insulating layer 14 includes, but is not limited to, silicon oxide, silicon nitride with good insulating performance.

The gate 15 is disposed on the gate insulating layer 14 of the display area 101. A structure of the gate 15 includes, but is not limited to, molybdenum aluminum molybdenum, and it has good electrical conductivity.

The dielectric layer 16 is disposed on the buffer layer 13 and covers the gate 15. The dielectric layer 16 extends from the display area 101 to the non-display area 102. The dielectric layer 16 includes a first through hole 161 and a second recess 162. The first through hole 161 extends through the dielectric layer 16, and the source/drain 17 fill the first through hole 161 and extend to an upper surface of the active layer 13. The second recess 162 is recessed below the dielectric layer 16. Material of the dielectric layer 16 includes, but is not limited to, silicon oxide and silicon nitride with good insulating performance.

The source/drain 17 are disposed in the first through hole 161 of the display area 101, protrude from an upper surface of the dielectric layer 16 of the display area 101, and are connected to the active layer 13. Material of the source/drain 17 includes, but are not limited to, titanium, copper, aluminum, molybdenum, chromium, and combinations thereof.

The ring-shaped metal layer 2 fills the second recess 162 of the non-display area, protrudes from the upper surface of the dielectric layer 16, and is arranged on the same layer as the source/drain 17.

The passivation layer 18 is disposed on the source/drain 17 and the dielectric layer 16, and extends from the display area 101 to the non-display area 102. The passivation layer 18 includes a protrusion 18a corresponding to an edge of the ring-shaped metal layer 2. The protrusion 18a is a part of the passivation layer 18. The protrusion 18a surrounds the ring-shaped metal layer 2, which can effectively prevent moisture and oxygen from permeating into the edge of the ring-shaped metal layer 2 and improves an encapsulation performance of the display panel.

The pixel electrode 20 is disposed on the planarization layer 19 of the display area 101 and is connected to the source/drain 17. Material of the pixel electrode 20 includes, but is not limited to, indium tin oxide.

The pixel definition layer 21 is disposed on the planarization layer 19 and the pixel electrode 20 of the display area 101, and the pixel definition layer 21 is provided with a pixel definition layer through-hole that extends through the pixel electrode 20.

The luminous layer 22 is disposed on the thin film transistor structure layer 1 and is disposed in the display area 101. Specifically, the luminous layer 22 is disposed in the pixel definition layer through-hole and is connected to the pixel electrode 20.

The first electrode 4 is a cathode, which extends from the pixel definition layer 21 of the display area 101 to the protrusion 18a of the non-display area 102, and extends from a surface of the protrusion 18a to an upper surface of the ring-shaped metal layer 2, and completely covers the upper surface of the ring-shaped metal layer 2. Specifically, the first electrode 4 covers the luminous layer 22 and the pixel definition layer 21, and covers an edge of the pixel definition layer 21, an edge of the planarization layer 19, edges of the passivation layer 18 and the protrusion 18a, and covers the upper surface of the ring-shaped metal layer 2, so that the first electrode 4 directly contacts with the ring-shaped metal layer 2, thereby forming a direct metal-to-metal contact and improving an ability of preventing external moisture and oxygen from permeating to an interface. If moisture intrudes from a side of the display device, a dense oxide film formed on the surface of the cathode acts as a barrier. Also, a height of protrusion 18a is not higher than that of passivation layer 18, and its shape is trapezoidal. The protrusion 18a serves as a small dyke to block moisture and oxygen by layers, thereby providing an encapsulation effect of the display device, enhancing a sealing performance of the light emitting device, and extending a lifespan.

Furthermore, the ring-shaped metal layer 2 can also provide a good contact surface for the first electrode 4, so that the first electrode 4 is fixedly connected to the ring-shaped metal layer 2. Material of the first electrode 4 includes, but is not limited to, active metals such as aluminum, chromium, and barium. The material of the first electrode 4 is preferably aluminum. When external moisture and oxygen permeates into the display device, a metal oxide formed on an outside of the first electrode 4 serves as a natural barrier, thereby improving the encapsulation performance of the display device.

In this embodiment, an orthographic projection of the planarization layer 19 and an orthographic projection of the pixel definition layer 21 are located within an orthographic projection of the first electrode 4, to ensure that the first electrode 4 surrounds the display area, and to improve the encapsulation performance of the display device. Material of ring-shaped metal layer 2 includes, but is not limited to, active metals such as aluminum, chromium, and barium. If the materials of the first electrode 4 and the ring-shaped metal layer 2 are the same, the encapsulation performance of the display device can be further improved.

The encapsulation layer 5 is disposed on the first electrode 4. The encapsulation layer 5 includes an inorganic layer 51, a cover layer 52, a moisture absorption layer 53, a sealant layer 54, and a cover plate 55. The inorganic layer 51 is disposed on the first electrode and extends from the display area 101 to the non-display area 102. Material of the inorganic layer 51 is an inorganic material and has a high moisture and oxygen blocking performance. The cover layer 52 is disposed on the inorganic layer 51 and extends from the display area 101 to the non-display area 102. Material of the cover layer 52 includes, but is not limited to, metal oxides or organic silicon. The cover layer 52 not only has excellent barrier properties, but also avoids a formation of Newton's rings, thereby improving a strength of a screen.

The moisture absorption layer 53 is disposed on the substrate of the non-display area, and surrounds the cover layer 52. Material of the moisture absorption layer 53 includes, but is not limited to, metal oxide or organic silicon, and has excellent barrier properties. The sealant layer 54 is disposed on the substrate of the non-display area, and surrounds the moisture absorption layer 53. Material of the sealant layer 54 includes, but is not limited to, a metal oxide or an organic silica gel, and has excellent barrier properties. The cover plate 55 is disposed on the cover layer 52, the moisture absorption layer 53, and the sealant layer 54 to isolate an influence of external moisture and oxygen on the device and to extend the lifespan of the display device.

As shown in FIG. 1 to FIG. 2, the non-display area 102 surrounds the display area 101, the first electrode 4 surrounds the display area 101, the ring-shaped metal layer 2 surrounds the first electrode 4, and the encapsulation layer 5 surrounds the ring-shaped metal layer 2. Thus, the display area 101 is wrapped in layers. If cracks occur on an edge of the inorganic layer 51 of the encapsulation layer 5 and a contact is not good, after an external moisture and oxygen permeates, the first electrode 4 and the ring-shaped metal layer 2 will form a dense oxide, which effectively blocks a continued transmission of moisture and oxygen and prevents moisture and oxygen from permeating into the luminous layer 22, the pixel definition layer 21, and other components inside the display area 101, thereby improving the encapsulation performance of the display device and extending its lifespan.

An embodiment of the present disclosure also provides a manufacturing method of a display device. The display device includes a display area and a non-display area. The non-display area surrounds the display area. The manufacturing method of the display device includes the following steps.

A thin film transistor structure layer is formed. A ring-shaped metal layer is formed in the thin film transistor structure layer. The ring-shaped metal layer is disposed in the non-display area and surrounds the display area. A luminous layer is formed on the thin film transistor structure layer and disposed in the display area. A first electrode is formed above the luminous layer, and the first electrode extends from the display area to a surface of the ring-shaped metal layer of the non-display area.

Specifically, the step of forming the thin film transistor structure layer includes the following steps.

A substrate is provided. Material of the substrate includes, but is not limited to, glass, ceramic, plastic, and alloy materials.

A buffer layer is formed on the substrate, and the buffer layer extends from the display area to the non-display area.

An active layer is formed on the buffer layer of the display area.

A gate insulating layer is formed on the active layer. Material of the gate insulating layer includes, but is not limited to, silicon oxide and silicon nitride, and has a good insulating performance.

A gate is formed on the gate insulating layer of the display area. A structure of the gate includes, but is not limited to, molybdenum aluminum molybdenum, and has good electrical conductivity.

A dielectric layer is formed on the buffer layer, and the dielectric layer covers the gate. The dielectric layer extends from the display area to the non-display area. Material of the dielectric layer includes, but is not limited to, silicon oxide and silicon nitride, and has a good insulation performance.

Figure 3:
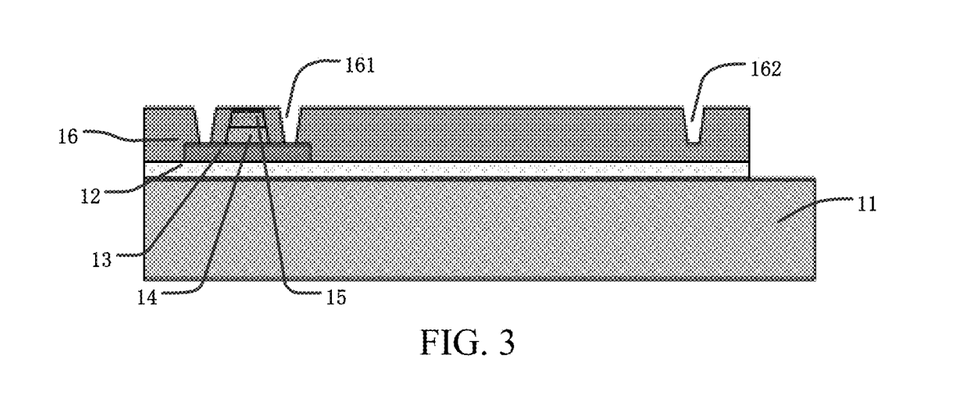
FIG. 3 is a schematic diagram of a dielectric layer of the first embodiment.

As shown in FIG. 3, in a process of forming the dielectric layer 16, the dielectric layer 16 includes a first through hole 161 and a second recess 162. The first through hole 161 extends through the dielectric layer 16, and the second recess 162 is recessed below the dielectric layer 16.

A source/drain is formed in the first through hole, and the source/drain protrudes from a surface of the dielectric layer of the display area, and the source/drain is connected to the active layer. The source/drains fill the first through hole and extends to an upper surface of the active layer. Material of the source/drain includes, but is not limited to, titanium, copper, aluminum, molybdenum, chromium, and combinations thereof.

The ring-shaped metal layer is formed in the second recess, and the ring-shaped metal layer protrudes from the surface of the dielectric layer and is disposed on the same layer as the source/drain. The ring-shaped metal layer fills the second recess and extends to the upper surface of the dielectric layer. Material of the ring-shaped metal layer includes, but is not limited to, active metals such as aluminum, chromium, and barium.

Figure 4:
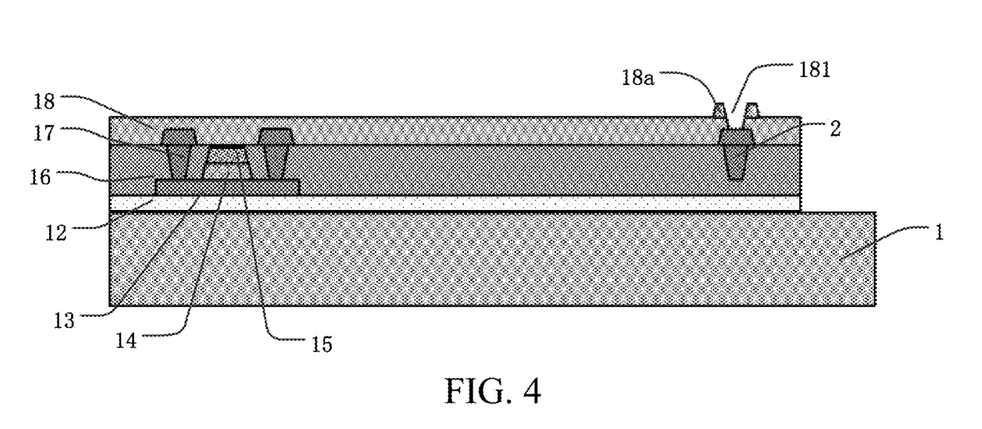
FIG. 4 is a schematic diagram of a passivation layer of the first embodiment.

A passivation layer is formed on the source/drain and the dielectric layer, and the passivation layer extends from the display area to the non-display area, and the passivation layer includes a protrusion corresponding to the ring-shaped metal layer. As shown in FIG. 4, after the passivation layer 18 is patterned, a second through hole 181 is provided at the passivation layer 18 corresponding to the ring-shaped metal layer 2, and a protrusion 18a is provided on both sides of the second through hole 181. The protrusion 18a serves as a small dyke to block moisture and oxygen by layers, thereby providing an encapsulation effect of the display device A planarization layer is formed on the passivation layer. The planarization layer is provided with a planarization layer through-hole, and the planarization layer through-hole extends from the planarization layer to a surface of the source/drain.

A pixel electrode is formed on the planarization layer of the display area, and the pixel electrode is connected to the source/drain. Specifically, the pixel electrode fills the planarization layer through hole and is connected to the source/drain.

A pixel definition layer is formed on the planarization layer and the pixel electrode of the display area. In the step of forming the pixel definition layer, the pixel definition layer is provided with a pixel definition layer through-hole, and the pixel definition layer through-hole extends to a surface of the pixel electrode.

The luminous layer is formed in the pixel definition layer through-hole.

The first electrode is on the luminous layer and the pixel definition layer. The first electrode extends from the display area to the surface of the ring-shaped metal layer of the non-display area, and completely covers the surface of the ring-shaped metal layer. Specifically, the first electrode covers the luminous layer and the pixel definition layer, and covers an edge of the pixel definition layer, an edge of the planarization layer, edges of the passivation layer and the protrusion, and covers the upper surface of the ring-shaped metal layer, so that the first electrode directly contacts with the ring-shaped metal layer, thereby forming a direct metal-to-metal contact and improving an ability of preventing external moisture and oxygen from permeating to an interface. If moisture intrudes from a side of the display device, a dense oxide film formed on the surface of the cathode acts as a barrier. Also, a height of protrusion is not higher than that of passivation layer, and its shape is trapezoidal. The protrusion serves as a small dyke to block moisture and oxygen by layers, thereby providing an encapsulation effect of the display device, enhancing a sealing performance of the light emitting device, and extending a lifespan.

Furthermore, the ring-shaped metal layer can also provide a good contact surface for the first electrode, so that the first electrode is fixedly connected to the ring-shaped metal layer. Material of the first electrode includes, but is not limited to, active metals such as aluminum, chromium, and barium. The material of the first electrode is preferably aluminum. When external moisture and oxygen permeates into the display device, a metal oxide formed on an outside of the first electrode serves as a natural barrier, thereby improving the encapsulation performance of the display device.

An inorganic layer is formed on the first electrode, and the inorganic layer extends from the display area to the non-display area. Material of the inorganic layer is an inorganic material and has a high moisture and oxygen blocking performance.

A cover layer is formed over a cover plate. The cover layer extends from the display area to the non-display area. Specifically, a filler is sprayed on the cover plate drop by drop using a method such as dispensing or inkjet printing to form the cover layer. The cover layer is a circular filler or a granular filler. Material of the cover layer includes, but is not limited to, a metal oxide or a silicone gel. The cover layer has excellent barrier properties, and can also avoid a formation of Newton's rings and improve a strength of a screen.

A moisture absorption layer is formed on the cover plate of the non-display area, and the moisture absorption layer surrounds the cover layer. Specifically, a ring-shaped moisture absorption layer is formed at an edge of the cover plate by a dispensing method. Material of the moisture absorption layer includes, but is not limited to, a metal oxide or an organic silica gel, and has excellent barrier properties.

A sealant layer is formed on the cover plate of the non-display area, and the sealant layer surrounds the moisture absorption layer. Specifically, a ring-shaped sealant layer is formed at an edge of the cover plate by the dispensing method, and the sealant layer surrounds the moisture absorption layer. Material of the sealant layer includes, but is not limited to, a metal oxide or an organic silica gel, and has excellent barrier properties.

The cover plate is attached to the inorganic layer, and the cover layer is disposed on the inorganic layer. In a process of attaching the cover plate to the inorganic layer, the cover layer penetrates into a gap of the inorganic layer little by little, so that the gap of the inorganic layer is completely filled by pressing, so as to avoid a formation of Newton's rings and enhance the strength of the screen of the display device. After the cover plate and the inorganic layer are completely bonded, the cover layer, the moisture absorption layer, and the sealant layer are cured by using ultraviolet rays or heating.

In this embodiment, the substrate and the cover plate of the display device are preferably glass substrates. After forming the thin film transistor structure layer on the substrate and after forming the cover layer on the cover plate, the substrate and the cover plate are assembled to form a screen of the display device. Since the substrate and the cover plate effectively isolate the influence of external moisture and oxygen on the device, the cover layer, the moisture absorption layer, and the sealant layer of the encapsulation layer are provided with excellent barrier performance. Therefore, the manufacturing method of the display device provided in this implementation can extend the lifespan of the display device.

In comparison with the prior art, this embodiment provides the manufacturing method of the display device, where first electrode is formed on the luminous layer, the first electrode forms a complete pattern of an entire surface, and the edge of the first electrode is embedded in an opening of the passivation layer and wrapped its edge. Also, the first electrode covers an exposed upper surface of the ring-shaped metal layer, thereby forming a direct metal-to-metal contact, improving an ability of preventing external moisture and oxygen from permeating to an interface. If moisture intrudes from a side, a dense oxide film formed on the surface of the first electrode acts as a barrier. At the same time, the protrusion of the passivation layer serves as a small dyke to block moisture and oxygen by layers.

The present disclosure provides a display device and a manufacturing method thereof. The first electrode extends from the display area to the surface of the ring-shaped metal layer of the non-display area, and completely covers the surface of the ring-shaped metal layer, thereby forming a direct metal-to-metal contact and improving an ability of preventing external moisture and oxygen from permeating to an interface. If moisture intrudes from a side, a dense oxide film formed on the surface of the first electrode acts as a barrier. At the same time, the passivation layer includes the protrusion corresponding to the ring-shaped metal layer. The protrusion serves as a small dyke to block moisture and oxygen by layers, thereby enhancing a sealing performance of the light emitting element and extending a lifespan.

Second Embodiment

This embodiment provides a display device and a manufacturing method including most technical features of the first embodiment, and the differences are as follows. First, a ring-shaped metal layer is provided on a dielectric layer and protrudes from a passivation layer. It can also provide a good contact surface for a first electrode, so that the first electrode is fixedly connected to the ring-shaped metal layer. Second, the display device includes at least one first recess extending from a pixel definition layer to a surface of the passivation layer to cut off a moisture transmission path. Third, an encapsulation layer includes a water-blocking and moisture-absorbing adhesive layer and a metal foil, and does not include a cover layer and a cover plate, which can also block moisture and oxygen.

Figure 5:
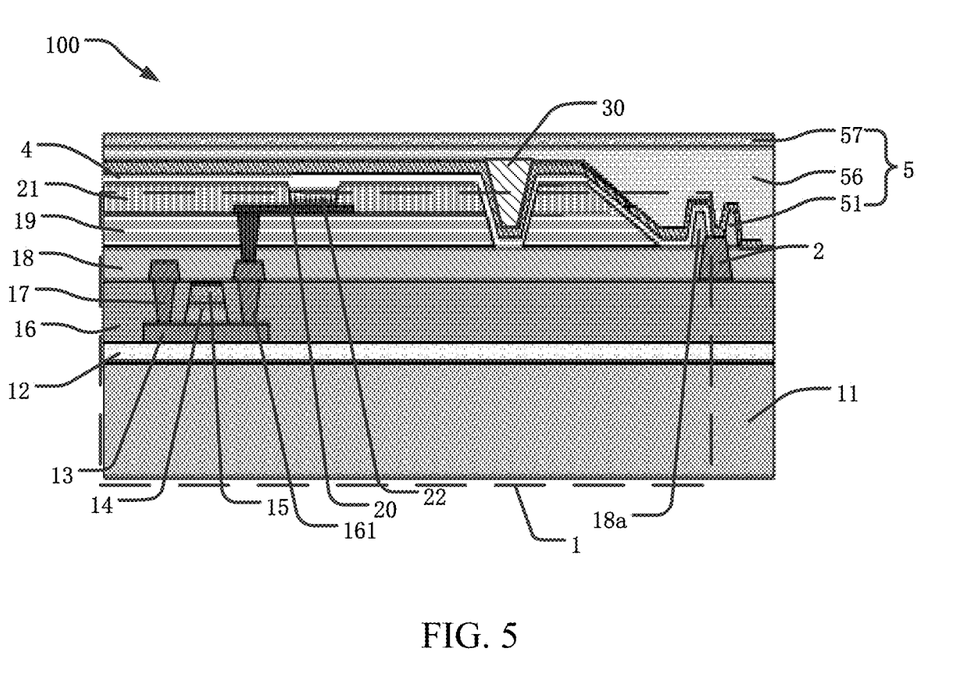
FIG. 5 is a cross-sectional view of a display device according to a second embodiment.

As shown in FIG. 5, the display device 100 further includes a thin film transistor structure layer 1, a ring-shaped metal layer 2, a luminous layer 22, a first electrode 4, and an encapsulation layer 5.

The thin film transistor structure layer 1 includes a substrate 11, a buffer layer 12, an active layer 13, a gate insulating layer 14, a gate 15, a dielectric layer 16, a source/drain 17, a passivation layer 18, a planarization layer 19, a pixel electrode 20, and a pixel definition layer 21.

The dielectric layer 16 is disposed on the buffer layer 12 and covers the gate 15. The dielectric layer 16 extends from the display area 101 to the non-display area 102. The dielectric layer 16 is provided with a second through hole 161 which extends through the dielectric layer 16. Material of the dielectric layer 16 includes, but is not limited to, silicon oxide and silicon nitride, and has a good insulating performance. The source/drain 17 is disposed in the second through hole 161 and protrudes from an upper surface of the dielectric layer 16 of the display area 101. The source/drain 17 is connected to the active layer 13. The ring-shaped metal layer 2 is disposed on the upper surface of the dielectric layer 16.

At least one first recess 30 is provided in the display device 100. The first recess 30 extends through the pixel definition layer 21 and the planarization layer 19, and the first recess 30 extends from the pixel definition layer 21 to the surface of the passivation layer 18. In the display area, the first electrode 4 and an inorganic layer 51 are disposed in the first recess 30. Material filled in the first recess 30 is polyimide or an organic material with equivalent functions, which can make moisture transmit laterally along the first recess 30, and cut off a moisture transmission path, thereby protecting the luminous layer of the display area from being affected, effectively blocking the moisture and oxygen, improving an encapsulation performance of the display device. In comparison with the first embodiment, setting one or more first recesses 30 in the display device can further improve the encapsulation performance of the display device.

The encapsulation layer 5 includes the inorganic layer 51, a water-blocking and moisture-absorbing adhesive layer 56, and a metal foil 57. The inorganic layer 51 is disposed on the first electrode 4 and extends from the display area 101 to the non-display area 102. Material of the inorganic layer 51 is an inorganic material and has a high moisture and oxygen blocking performance. The water-blocking and moisture-absorbing adhesive layer 56 is disposed on the inorganic layer 51 and extends from the display area 101 to the non-display area 102. Material of the water-blocking and moisture-absorbing adhesive layer 56 includes, but is not limited to, a metal oxide or an organic silica gel. The metal foil 57 is disposed on the water-blocking and moisture-absorbing adhesive layer 56 and extends from the display area 101 to the non-display area 102. The metal foil 57 includes, but is not limited to, invar alloy with different ratios. In comparison with the first embodiment, the display device provided in this embodiment uses metal foil instead of the cover plate in the first embodiment, which has good rigidity and moisture and oxygen barrier properties, thereby ensuring the encapsulation performance of the display device. It should be noted that, in other embodiments, the encapsulation method of the display device is not limited, as long as a better encapsulation performance can be achieved.

In this embodiment, the passivation layer 18 includes a protrusion 18a corresponding to the ring-shaped metal layer 2. A height of the protrusion 18a is higher than the planarization layer 19. A shape of protrusion 18a is a trapezoidal structure, which forms a small dyke. The protrusion 18a can protect a lateral side of the luminous layer 22 in the display area 101, thereby effectively achieving the encapsulation performance of the display device.

This embodiment also provides a manufacturing method of a display device. The display device includes a display area and a non-display area. The non-display area surrounds the display area. The manufacturing method of the display device includes the following steps.

A thin film transistor structure layer is formed.

A ring-shaped metal layer is formed in the thin film transistor structure layer, and the ring-shaped metal layer is disposed in the non-display area and surrounds the display area.

A luminous layer is formed on the thin film transistor structure layer and disposed in the display area.

A first electrode is formed above the luminous layer, and the first electrode extends from the display area to a surface of the ring-shaped metal layer of the non-display area.

Specifically, the step of forming the thin film transistor structure layer includes the following steps.

A substrate is provided. Material of the substrate includes, but is not limited to, glass, ceramic, plastic, and alloy materials.

A buffer layer is formed on the substrate, and the buffer layer extends from the display area to the non-display area.

An active layer is formed on the buffer layer of the display area.

A gate insulating layer is formed on the active layer. Material of the gate insulating layer includes, but is not limited to, silicon oxide and silicon nitride, and has a good insulating performance.

A gate is formed on the gate insulating layer of the display area. A structure of the gate includes, but is not limited to, molybdenum aluminum molybdenum, and has good electrical conductivity.

A dielectric layer is formed on the buffer layer, and the dielectric layer covers the gate. The dielectric layer extends from the display area to the non-display area. The dielectric layer is provided with a second through hole. Material of the dielectric layer includes, but is not limited to, silicon oxide and silicon nitride, and has a good insulation performance. In a process of forming the dielectric layer, the dielectric layer includes the second through hole, and the second through hole extends through the dielectric layer.

A source/drain is formed in the second through hole, and the source/drain protrudes from a surface of the dielectric layer of the display area, and the source/drain is connected to the active layer. The source/drains fills the second through hole and extends to an upper surface of the dielectric layer. Material of the source/drain includes, but is not limited to, titanium, copper, aluminum, molybdenum, chromium, and combinations thereof.

The ring-shaped metal layer is formed on the dielectric layer.

A passivation layer is formed on the source/drain and the dielectric layer, and the passivation layer extends from the display area to the non-display area, and the passivation layer includes a protrusion corresponding to the ring-shaped metal layer.

A planarization layer is formed on the passivation layer of the display area. The planarization layer is provided with a planarization layer through-hole, and the planarization layer through-hole extends from the planarization layer to a surface of the source/drain.

A pixel electrode is formed on the planarization layer of the display area, and the pixel electrode is connected to the source/drain. Specifically, the pixel electrode fills the planarization layer through hole and is connected to the source/drain.

A pixel definition layer is formed on the planarization layer and the pixel electrode of the display area. In the step of forming the pixel definition layer, the pixel definition layer is provided with a pixel definition layer through-hole, and the pixel definition layer through-hole extends to a surface of the pixel electrode.

A first recess is formed, and the first recess extends from the pixel definition layer to a surface of the passivation layer. Filling the first recess with polyimide or an organic material of equivalent function can allow moisture to be transmitted laterally along the first recess, and can cut off a moisture transmission path, thereby protecting the luminous layer of the display area from being affected, effectively blocking the moisture and oxygen, and improving an encapsulation performance of the display device.

A first electrode is formed in the first recess and is formed on the luminous layer and the pixel definition layer. The first electrode extends from the display area to a surface of the ring-shaped metal layer of the non-display area. Specifically, the first electrode covers the luminous layer and the pixel definition layer, and covers an edge of the pixel definition layer, an edge of the planarization layer, edges of the passivation layer and the protrusion, and covers the upper surface of the ring-shaped metal layer, so that the first electrode directly contacts with the ring-shaped metal layer, thereby forming a direct metal-to-metal contact and improving an ability of preventing external moisture and oxygen from permeating to an interface. If moisture intrudes from a side of the display device, a dense oxide film formed on the surface of the cathode acts as a barrier. Also, a height of protrusion is not higher than that of planarization layer, and its shape is trapezoidal. The protrusion serves as a small dyke to block moisture and oxygen by layers, thereby providing an encapsulation effect of the display device, enhancing a sealing performance of the light emitting device, and extending a lifespan.

Furthermore, the ring-shaped metal layer can also provide a good contact surface for the first electrode, so that the first electrode is fixedly connected to the ring-shaped metal layer. Material of the first electrode includes, but is not limited to, active metals such as aluminum, chromium, and barium. The material of the first electrode is preferably aluminum. When external moisture and oxygen permeates into the display device, a metal oxide formed on an outside of the first electrode serves as a natural barrier, thereby improving the encapsulation performance of the display device.

An inorganic layer is formed on the first electrode, and the inorganic layer extends from the display area to the non-display area. Material of the inorganic layer is an inorganic material and has a high moisture and oxygen blocking performance.

A water-blocking and moisture-absorbing adhesive layer is formed on a metal foil and extends from the display area to the non-display area. The metal foil includes, but is not limited to, invar with different proportions.

The metal foil is attached to the inorganic layer, and the water-blocking and moisture-absorbing adhesive layer is disposed on the inorganic layer.

In comparison with the prior art, this embodiment provides the manufacturing method of the display device, where first electrode is formed on the luminous layer, the first electrode forms a complete pattern of an entire surface, and the edge of the first electrode is embedded in an opening of the passivation layer and wrapped its edge. Also, the first electrode covers an exposed upper surface of the ring-shaped metal layer, thereby forming a direct metal-to-metal contact, improving an ability of preventing external moisture and oxygen from permeating to an interface. If moisture intrudes from a side, a dense oxide film formed on the surface of the first electrode acts as a barrier. At the same time, the protrusion of the passivation layer serves as a small dyke to block moisture and oxygen by layers.

In comparison with the first embodiment, this embodiment provides one or more first recess 30 in the display device which can further improve the encapsulation performance of the display device.

This embodiment provides the display device and the manufacturing method thereof. The display device includes the display area and the non-display area. The non-display area surrounds the display area. The display area includes the first electrode, the ring-shaped metal layer, and the encapsulation layer. The display area is surrounded by the first electrode, the ring-shaped metal layer, and the encapsulation layer from the inside to the outside. When moisture and oxygen permeate into the inside of the display device from the outside, a dense oxide is formed on the outside of the first electrode, which effectively blocks the continued transmission of moisture and oxygen, thereby improving the encapsulation performance of the display device and extending its lifespan.

The above is only preferred embodiments of the present disclosure. It should be noted that, for those of ordinary skill in the art, without departing from the principles of the present disclosure, several improvements and modifications can be made, and these improvements and modifications should also be regarded as the protection scope of the present disclosure.

What is claimed is:

1. A display device, comprising:
    a display area and a non-display area surrounding the display area;
    a thin film transistor structure layer;
    a ring-shaped metal layer disposed in the thin film transistor structure layer, wherein the ring-shaped metal layer is disposed in the non-display area and surrounds the display area;
    a luminous layer disposed on the thin film transistor structure layer and disposed in the display area; and
    a first electrode disposed above the luminous layer, extending from the display area to a surface of the ring-shaped metal layer of the non-display area, and completely covering the surface of the ring-shaped metal layer;
    wherein the thin film transistor structure layer comprises:
    a substrate;
    a buffer layer disposed on the substrate and extending from the display area to the non-display area;
    an active layer disposed on the buffer layer;
    a gate insulating layer disposed on the active layer;
    a gate disposed on the gate insulating layer of the display area;
    a dielectric layer disposed on the buffer layer, wherein the dielectric layer covers the gate, and the dielectric layer extends from the display area to the non-display area;
    a source and a drain disposed on the dielectric layer of the display area and connected to the active layer;
    a passivation layer disposed on the source and the drain and extending from the display area to the non-display area, wherein the passivation layer comprises a protrusion corresponding to the ring-shaped metal layer;
    a planarization layer disposed on the passivation layer;
    a pixel electrode disposed on the planarization layer of the display area and connected to the source and the drain; and
    a pixel definition layer disposed on the planarization layer and the pixel electrode of the display area;
    wherein the first electrode extends from the pixel definition layer of the display area to the protrusion, and extends from a surface of the protrusion to the surface of the ring-shaped metal layer.

2. The display device as claimed in claim 1, wherein the ring-shaped metal layer is disposed on the dielectric layer and is arranged on a same layer as the source and the drain, or the ring-shaped metal layer is disposed on the dielectric layer and protrudes from the passivation layer.

3. The display device as claimed in claim 1, wherein a height of the protrusion is higher than the passivation layer.

4. The display device as claimed in claim 1, further comprising:
    an inorganic layer disposed on the first electrode and extending from the display area to the non-display area;
    a cover layer disposed on the inorganic layer and extending from the display area to the non-display area;
    a moisture absorption layer disposed on the substrate of the non-display area and surrounding the cover layer;
    a sealant layer disposed on the substrate of the non-display area and surrounding the moisture absorption layer; and
    a cover plate disposed on the cover layer, the moisture absorption layer, and the sealant layer.

5. The display device as claimed in claim 1, further comprising:
    an inorganic layer disposed on the first electrode and extending from the display area to the non-display area;
    a water-blocking and moisture-absorbing adhesive layer disposed on the inorganic layer and extending from the display area to the non-display area; and
    a metal foil disposed on the water-blocking and moisture-absorbing adhesive layer and extending from the display area to the non-display area.

6. The display device as claimed in claim 5, further comprising a first recess disposed in the display area, wherein the first recess extends from the pixel definition layer to a surface of the passivation layer, and the first electrode and the inorganic layer are sequentially disposed in the first recess.

7. A manufacturing method of a display device, wherein the display device comprises a display area and a non-display area surrounding the display area, and the manufacturing method of the display device comprises:
    forming a thin film transistor structure layer;
    forming a ring-shaped metal layer in the thin film transistor structure layer, wherein the ring-shaped metal layer is disposed in the non-display area and surrounds the display area;
    forming a luminous layer on the thin film transistor structure layer and disposed in the display area; and
    forming a first electrode above the luminous layer, wherein the first electrode extends from the display area to a surface of the ring-shaped metal layer of the non-display area, and completely covers the surface of the ring-shaped metal layer; wherein the step of forming the thin film transistor structure layer comprises:
    providing a substrate;
    forming a buffer layer on the substrate, wherein the buffer layer extends from the display area to the non-display area;
    forming an active layer on the buffer layer of the display area;
    forming a gate insulating layer on the active layer;
    forming a gate on the gate insulating layer of the display area;
    forming a dielectric layer on the buffer layer, wherein the dielectric layer covers the gate, the dielectric layer extends from the display area to the non-display area, and the dielectric layer comprises a first through hole and a second recess;
    forming a source and a drain in the first through hole, wherein the source and the drain protrude from a surface of the dielectric layer of the display area, and the source and the drain are connected to the active layer;
    forming the ring-shaped metal layer in the second recess, wherein the ring-shaped metal layer protrudes from the surface of the dielectric layer and is disposed on a same layer as the source and the drain;
    forming a passivation layer on the source, the drain, and the dielectric layer, wherein the passivation layer extends from the display area to the non-display area, and the passivation layer comprises a protrusion corresponding to the ring-shaped metal layer;

forming a planarization layer on the passivation layer;

forming a pixel electrode on the planarization layer of the display area and connecting the pixel electrode to the source and the drain; and forming a pixel definition layer on the planarization layer and the pixel electrode of the display area;

wherein after the thin film transistor structure layer is formed, the manufacturing method further comprises:

forming the first electrode on the luminous layer and the pixel definition layer;

forming an inorganic layer on the first electrode, wherein the inorganic layer extends from the display area to the non-display area;

forming a cover layer over a cover plate;

forming a moisture absorption layer on the cover plate of the non-display area, wherein the moisture absorption layer surrounds the cover layer;

forming a sealant layer on the cover plate of the non-display area, wherein the sealant layer surrounds the moisture absorption layer; and attaching the cover plate to the inorganic layer, wherein the cover layer is disposed on the inorganic layer; and wherein the first electrode extends from the pixel definition layer of the display area to the protrusion, and extends from a surface of the protrusion to the surface of the ring-shaped metal layer.

8. A manufacturing method of a display device, wherein the display device comprises a display area and a non-display area surrounding the display area, and the manufacturing method of the display device comprises:

forming a thin film transistor structure layer;

forming a ring-shaped metal layer in the thin film transistor structure layer, wherein the ring-shaped metal layer is disposed in the non-display area and surrounds the display area;

forming a luminous layer on the thin film transistor structure layer and disposed in the display area; and forming a first electrode above the luminous layer, wherein the first electrode extends from the display area to a surface of the ring-shaped metal layer of the non-display area, and completely covers the surface of the ring-shaped metal layer;

wherein the step of forming the thin film transistor structure layer comprises:

providing a substrate;

forming a buffer layer on the substrate, wherein the buffer layer extends from the display area to the non-display area;

forming an active layer on the buffer layer of the display area;

forming a gate insulating layer on the active layer;

forming a gate on the gate insulating layer of the display area;

forming a dielectric layer on the buffer layer, wherein the dielectric layer covers the gate, and the dielectric layer extends from the display area to the non-display area, and the dielectric layer comprises a second through hole;

forming a source and a drain in the second through hole, wherein the source and the drain protrude from a surface of the dielectric layer of the display area, and the source and the drain are connected to the active layer;

forming the ring-shaped metal layer on the dielectric layer;

forming a passivation layer on the source, the drain, and the dielectric layer, wherein the passivation layer extends from the display area to the non-display area, and the passivation layer comprises a protrusion corresponding to the ring-shaped metal layer;

forming a planarization layer on the passivation layer of the display area;

forming a pixel electrode on the planarization layer of the display area and connecting the pixel electrode to the source and the drain;

forming a pixel definition layer on the planarization layer and the pixel electrode of the display area; and forming a first recess, wherein the first recess extends from the pixel definition layer to a surface of the passivation layer;

wherein after the thin film transistor structure layer is formed, the manufacturing method further comprises:

forming the first electrode in the first recess and on the luminous layer and the pixel definition layer;

forming an inorganic layer on the first electrode, wherein the inorganic layer extends from the display area to the non-display area;

forming a water-blocking and moisture-absorbing adhesive layer on a metal foil, wherein the water-blocking and moisture-absorbing adhesive layer extends from the display area to the non-display area; and attaching the metal foil to the inorganic layer, and disposing the water-blocking and moisture-absorbing adhesive layer on the inorganic layer; and wherein the first electrode extends from the pixel definition layer of the display area to the protrusion, and extends from a surface of the protrusion to the surface of the ring-shaped metal layer.

* * * * *

UNITED STATES PATENT AND TRADEMARK OFFICE
CERTIFICATE OF CORRECTION

| | |
|---|---|
| PATENT NO. | : 11,417,855 B2 |
| APPLICATION NO. | : 16/624208 |
| DATED | : August 16, 2022 |
| INVENTOR(S) | : Yanying Du |

It is certified that error appears in the above-identified patent and that said Letters Patent is hereby corrected as shown below:

On the Title Page

Item (73) change "SHENZHEN CHINA STAR OPTOELECTRONICS; SHENZHEN, (CN); SEMICONDUCTOR DISPLAY TECHNOLOGY CO., LTD., SHENZHEN, (CN)" to -- SHENZHEN CHINA STAR OPTOELECTRONICS SEMICONDUCTOR DISPLAY TECHNOLOGY CO., LTD., SHENZHEN, (CN) --

Signed and Sealed this
Twenty-seventh Day of September, 2022

Katherine Kelly Vidal
*Director of the United States Patent and Trademark Office*